(12) United States Patent
Brandt

(10) Patent No.: US 9,273,627 B2
(45) Date of Patent: Mar. 1, 2016

(54) INJECTION DEVICE

(75) Inventor: Martin Brandt, Wörth a.d. Donau (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 280 days.

(21) Appl. No.: 13/984,236

(22) PCT Filed: Feb. 1, 2012

(86) PCT No.: PCT/EP2012/051692
§ 371 (c)(1),
(2), (4) Date: Aug. 7, 2013

(87) PCT Pub. No.: WO2012/107336
PCT Pub. Date: Aug. 16, 2012

(65) Prior Publication Data
US 2013/0327301 A1 Dec. 12, 2013

(30) Foreign Application Priority Data
Feb. 8, 2011 (DE) .......... 10 2011 003 751

(51) Int. Cl.
*F02D 41/20* (2006.01)
*H01L 41/04* (2006.01)
(Continued)

(52) U.S. Cl.
CPC .......... *F02D 41/2096* (2013.01); *F02D 41/247* (2013.01); *F02D 41/30* (2013.01);
(Continued)

(58) Field of Classification Search
CPC .......... F02D 41/2096; F02M 51/0603; F02M 2200/21; H01L 41/04; H01L 41/042; H01L 41/044

USPC .......... 123/498, 490; 239/102.2; 310/316.03, 310/317, 323.06, 311, 316.01; 73/114.51
See application file for complete search history.

(56) References Cited

U.S. PATENT DOCUMENTS

| 4,838,080 A | 6/1989 | Okano ........ 73/114.47 |
| 6,487,505 B1 | 11/2002 | Mock et al. ........ 702/33 |

(Continued)

FOREIGN PATENT DOCUMENTS

| DE | 3813934 A1 | 11/1988 | ........ F02M 65/00 |
| DE | 19804196 A1 | 8/1999 | ........ F02D 41/20 |

(Continued)

OTHER PUBLICATIONS

International Search Report and Written Opinion, Application No. PCT/EP2012/051692, 16 pages, Jun. 6, 2012.

*Primary Examiner* — Mahmoud Gimie
(74) *Attorney, Agent, or Firm* — Slayden Grubert Beard PLLC

(57) ABSTRACT

An injection device for an internal combustion engine includes a piezo actuator for moving a valve piston, and a control unit for actuating the piezo actuator. The control unit supplies electrical pulses having different pulse energy to the piezo actuator and determines a return stroke between the piezo actuator and valve piston or a time delay caused by the return stroke. The control unit selects the pulse energies such that a maximum excursion of a movement of the piezo actuator caused by at least one pulse is smaller than the return stroke, whereas a maximum excursion of a piezo actuator movement caused by another pulse(s) is greater than the return stroke, after each of the pulses detects a frequency spectrum of a voltage signal at the piezo actuator during the movement caused by the respective pulse, and determines the return stroke or time delay based on these frequency spectra.

13 Claims, 8 Drawing Sheets

(51) Int. Cl.
  *F02M 51/06*  (2006.01)
  *F02D 41/24*  (2006.01)
  *F02M 47/02*  (2006.01)
  *F02M 63/00*  (2006.01)
  *F02D 41/30*  (2006.01)

(52) U.S. Cl.
  CPC ........ *F02M 47/027* (2013.01); *F02M 51/0603* (2013.01); *F02M 63/0026* (2013.01); *F02M 63/0035* (2013.01); *H01L 41/04* (2013.01); *F02D 2041/2051* (2013.01); *F02D 2041/2055* (2013.01); *F02D 2200/0602* (2013.01); *F02M 2200/21* (2013.01); *F02M 2200/703* (2013.01); *H01L 41/042* (2013.01); *H01L 41/044* (2013.01)

(56) References Cited

U.S. PATENT DOCUMENTS

| 8,051,839 | B2* | 11/2011 | Spadafora et al. | 123/498 |
| 2007/0273246 | A1* | 11/2007 | Hopley et al. | 310/317 |
| 2007/0290573 | A1* | 12/2007 | Sykes et al. | 310/311 |
| 2008/0006243 | A1* | 1/2008 | Fujii | 123/472 |
| 2008/0027585 | A1* | 1/2008 | Wesquet et al. | 700/283 |
| 2009/0019935 | A1* | 1/2009 | Horak | 73/593 |
| 2009/0090333 | A1* | 4/2009 | Spadafora et al. | 123/494 |
| 2010/0059021 | A1* | 3/2010 | Rau et al. | 123/478 |
| 2010/0268440 | A1 | 10/2010 | Reichinger et al. | 701/103 |
| 2012/0031378 | A1 | 2/2012 | Brandt | 123/490 |
| 2013/0066538 | A1* | 3/2013 | Brandt et al. | 701/105 |

FOREIGN PATENT DOCUMENTS

| DE | 102005040533 A1 | 3/2007 | ............. F02D 41/20 |
| DE | 102007054374 A1 | 5/2009 | ............. F02D 41/20 |
| DE | 102009018289 B3 | 6/2010 | ............. F02D 41/20 |
| EP | 1887205 A1 | 2/2008 | ............. F02D 41/20 |
| WO | 2009/138422 A1 | 11/2009 | ............. F02D 41/20 |
| WO | 2012/107336 A1 | 8/2012 | ............. F02D 41/20 |

* cited by examiner

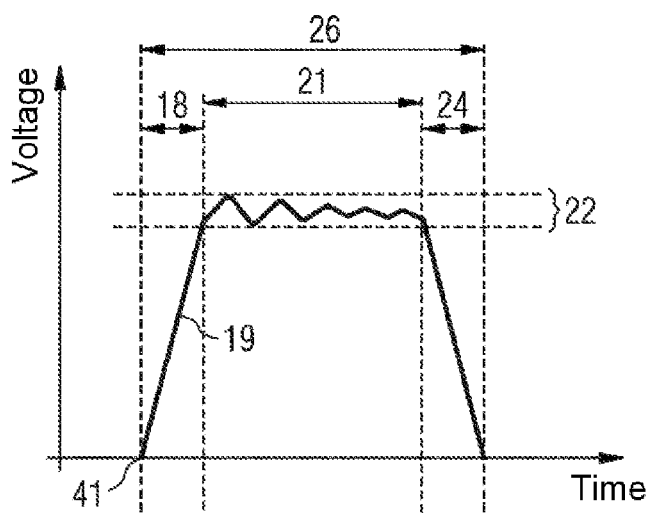
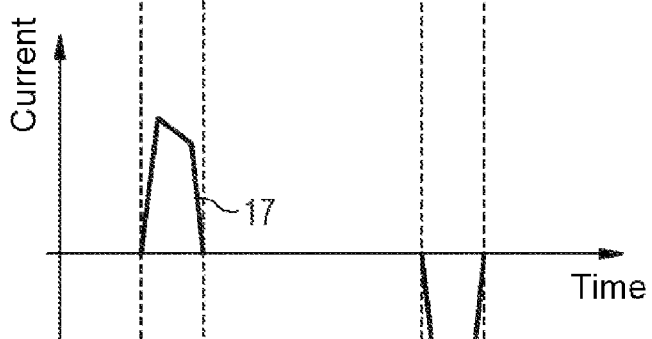
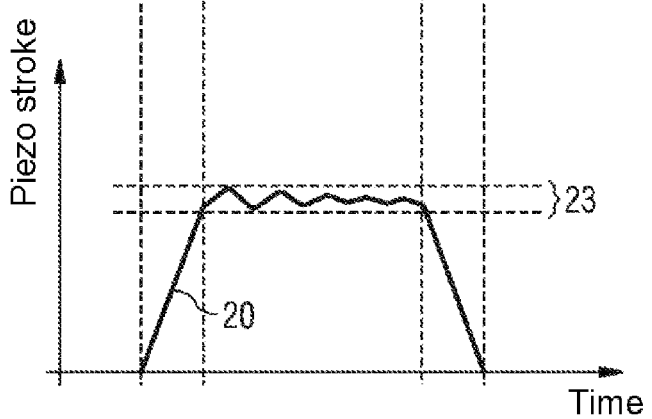
FIG 2

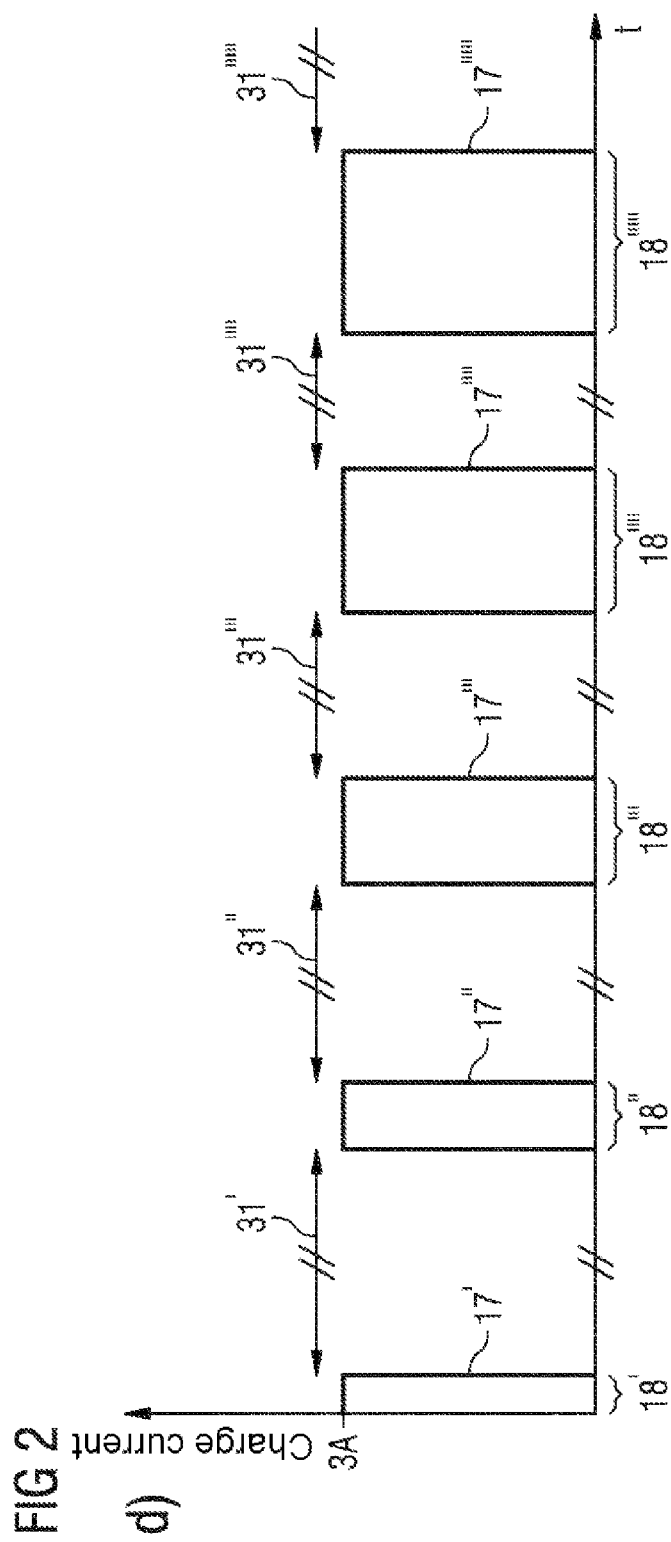

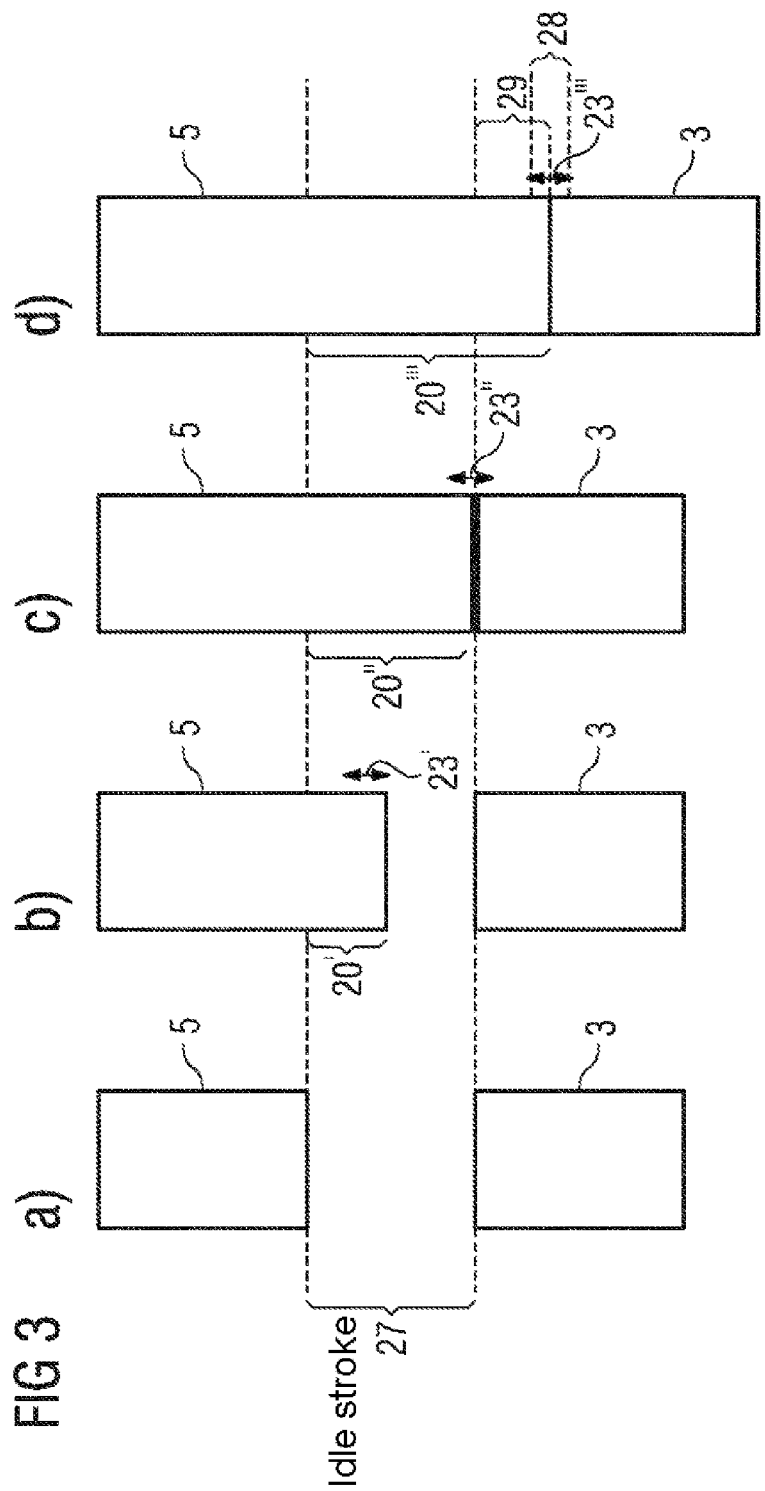

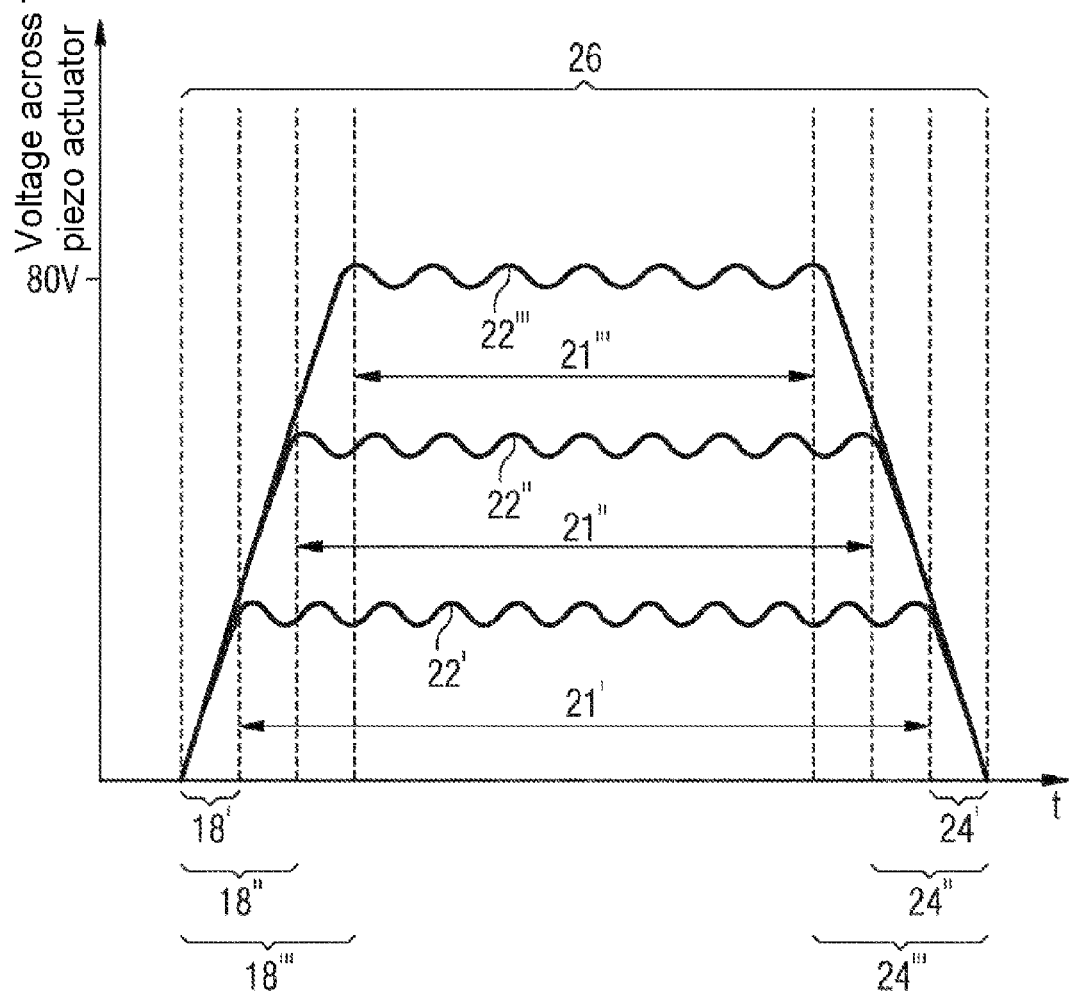

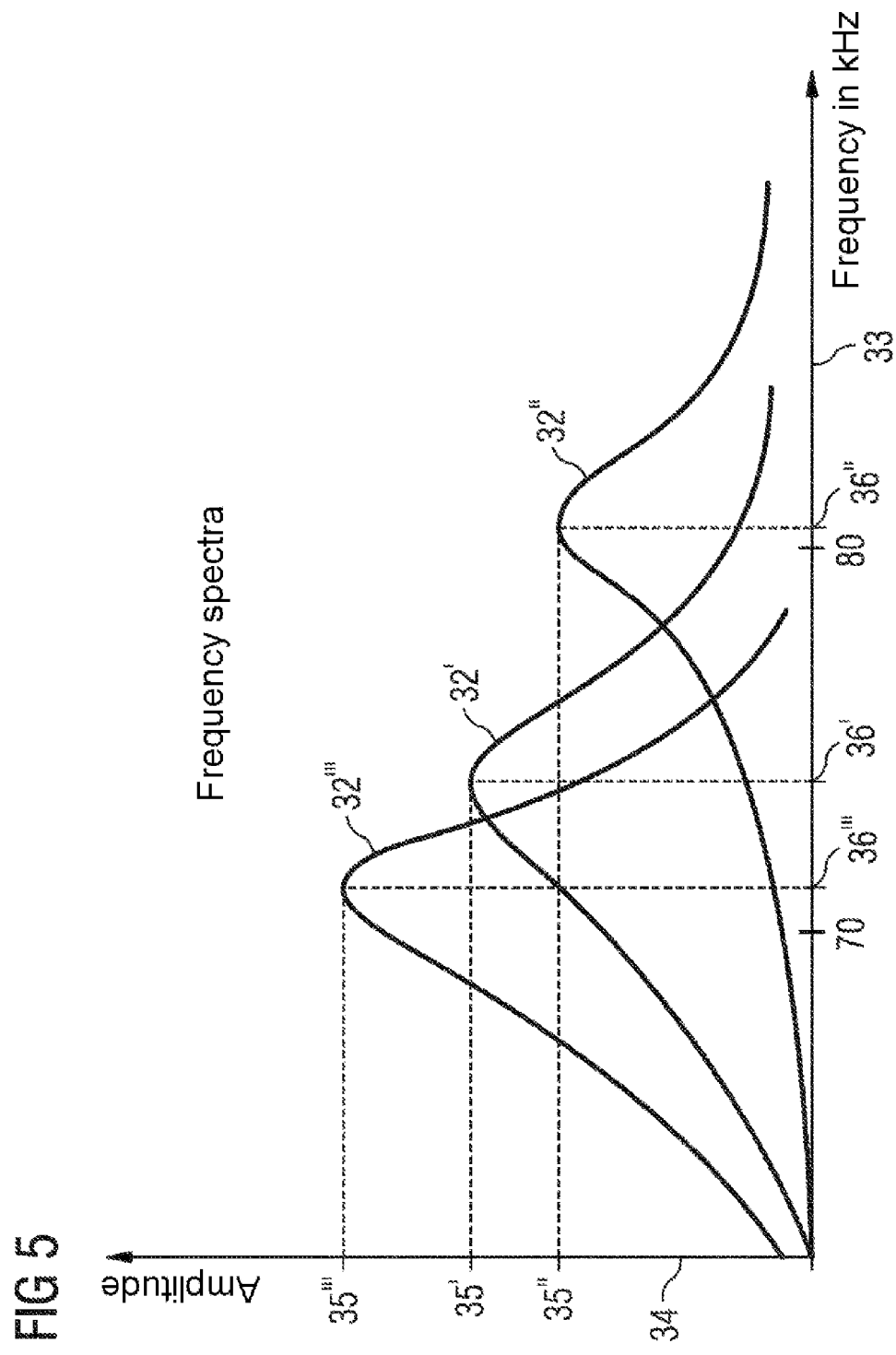

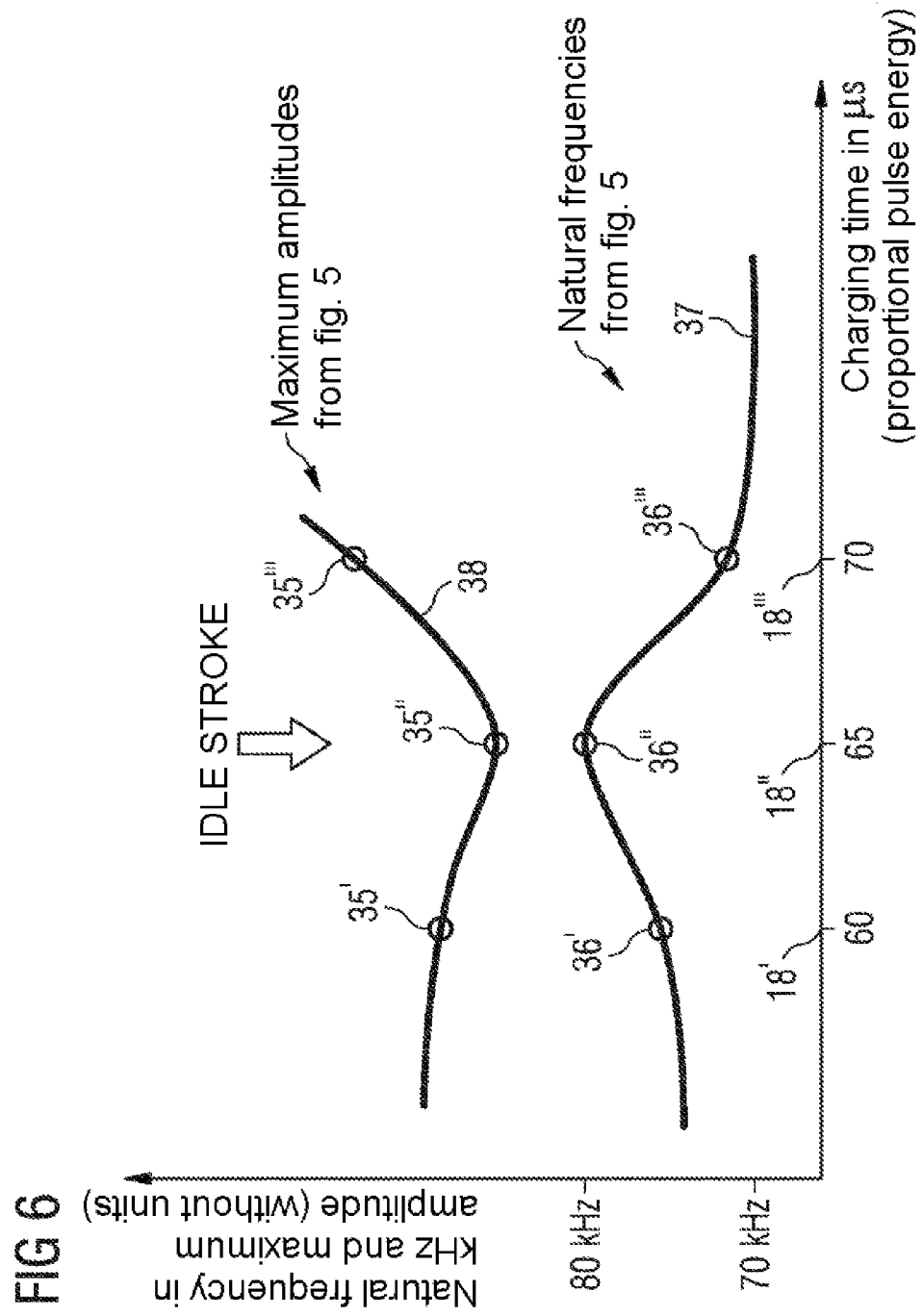

$$\Delta t_{corr} = \Delta t_{nom} + 2 \cdot \Delta t_{charge}$$

$$\Delta t_{charge} = \underbrace{\Delta t_{charge,act} - \Delta t_{charge,nom}}_{18''}$$

INJECTION DEVICE

CROSS-REFERENCE TO RELATED APPLICATIONS

This application is a U.S. National Stage Application of International Application No. PCT/EP2012/051692 filed Feb. 1, 2012, which designates the United States of America, and claims priority to DE Application No. 10 2011 003 751.9 filed Feb. 8, 2011, the contents of which are hereby incorporated by reference in their entirety.

TECHNICAL FIELD

This disclosure relates to an injection device for an internal combustion engine, and to a method for determining an idle stroke between a piezo actuator and a valve piston, which can be moved by the piezo actuator, of an injector for injecting fuel into an internal combustion engine or for determining a time delay which is caused by the idle stroke.

BACKGROUND

Known injection devices for internal combustion engines comprise an injector having a valve piston for controlling a flow of fuel and having a piezo actuator for moving the valve piston, and also a control unit for actuating the piezo actuator. In this case, the control unit is programmed to apply electrical pulses to the piezo actuator and therefore to cause the valve piston to move when a force which is exerted on the valve piston by the piezo actuator is greater than an opposing force. For interference-free operation of the internal combustion engine, it is necessary to control an injection instant and an injection duration, which are regulated by the movement of the valve piston, in a precisely timed manner.

Precisely timed control is inconsistent with, in particular, a so-called idle stroke between the piezo actuator and the valve piston. The idle stroke is defined as a distance through which the piezo actuator has to move or extend before it can move the valve piston. There is therefore a time delay between the actuation of the piezo actuator and the movement of the valve piston. In the present document, the term "idle stroke" is intended to be able to identify not only the length which corresponds to the idle stroke, but also another variable which is suitable as a measure for this idle stroke in the narrower sense of the word—that is to say for the said length—for example a charging quantity or an energy of an electrical pulse which allows the piezo actuator to overcome the idle stroke. However, on account of mechanical tolerances, temperature fluctuations, run-in behavior of a fuel and wear, an exact magnitude of the idle stroke is generally not known and furthermore subject to changes. In order to nevertheless be able to ensure interference-free operation of the internal combustion engine, it is therefore necessary to determine the idle stroke or the time delay which is caused by the idle stroke, and to take this into account when actuating the piezo actuator.

In a known method for determining the idle stroke, electrical pulses of different pulse energy are applied to the piezo actuator. In addition, a hydrostatic pressure is determined in a high-pressure store (rail), which supplies the injection device with fuel, by means of a pressure gauge before and after each of the pulses. If, in this case, the pulse energy of one of the pulses is so high that the piezo actuator overcomes the idle stroke and the opposing force, the piezo actuator moves the valve piston and causes a pressure drop in the rail. Knowing the pulse energy at which this pressure drop occurs allows the actuation of the piezo actuator to be adjusted during the operation of the internal combustion engine. One disadvantage of this method is that it cannot be carried out at any desired values of rotation speed, rail pressure or number of injection processes per second. If, in addition, a plurality of injectors are supplied with fuel by means of the same rail, a pressure drop in the rail cannot, under certain circumstances, be clearly attributed to an individual injector.

In another known method according to DE 10 2009 018 289 for determining the idle stroke, electrical pulses of different pulse energy are likewise applied to the piezo actuator. In addition, a voltage which is applied to the piezo actuator is determined after an end of a charging process and after a defined waiting time, the difference in said voltage being correlated with a change in force which is exerted on the piezo actuator. If the pulse energy is high enough to move the valve piston and as a result to cause a pressure drop in the rail, and a change in a force which is exerted on the piezo actuator by means of the valve piston accompanies the pressure drop, this change can be detected by means of the voltage across the piezo actuator. In this case too, knowing the pulse energy at which the change in force occurs allows the actuation of the piezo actuator to be adjusted during the operation of the internal combustion engine. One disadvantage of this method is that it cannot be used in valve pistons of so-called pressure-compensated valves in which the force which is exerted on the piezo actuator by means of the valve piston is independent of the rail pressure. However, valves specifically of this type are particularly cost-effective to operate since the piezo actuator requires little force to move these valves and as a result can be designed to be smaller.

SUMMARY

One embodiment provides an injection device for an internal combustion engine, wherein the injection device comprises an injector having a valve piston for controlling a flow of fuel, and a piezo actuator for moving the valve piston, and also a control unit for actuating the piezo actuator, and wherein the control unit is programmed to apply a plurality of electrical pulses of different pulse energy to the piezo actuator and to determine an idle stroke between the piezo actuator and the valve piston or a time delay which is caused by the idle stroke, wherein the control unit is further programmed: to select the pulse energies such that a maximum deflection of a movement of the piezo actuator, which movement is caused by at least one of the pulses, is smaller than the idle stroke, whereas a maximum deflection of a movement of the piezo actuator, which movement is caused by at least one further one of the pulses, is greater than the idle stroke; to detect a frequency spectrum of a voltage signal, which is applied to the piezo actuator, during the movement which is caused by the respective pulse, after each of the pulses; and to ascertain the idle stroke or the time delay from these frequency spectra.

In a further embodiment, the injector is formed in such a way that the movement of the piezo actuator comprises mechanical oscillations of the piezo actuator, and the voltage signal is correlated with the oscillations, wherein the frequency spectrum is in each case different in the case of the at least one movement of which the maximum deflection is smaller than the idle stroke, and in the case of the at least one further movement of which the maximum deflection is greater than the idle stroke, wherein the control unit is programmed to determine a difference between these frequency spectra.

In a further embodiment, the injector comprises a nozzle needle for opening and closing an injection opening in the injector, wherein the valve piston is designed to open and close the injection opening using the nozzle needle.

In a further embodiment, the control unit is programmed to select a maximum pulse energy of the pulses such that the injection opening remains closed.

In a further embodiment, the control unit is programmed to apply the pulses to the piezo actuator during normal operation of the injector such that the application is performed at a time between two injection processes.

In a further embodiment, the injection device includes a high-pressure store for providing fuel to the injector, and a pressure gauge, which is connected to the control unit, for detecting a hydrostatic pressure in the high-pressure store at least after each of the pulses, wherein the control unit is additionally programmed to ascertain the idle stroke or the time delay from a pressure drop in the high-pressure store.

In a further embodiment, the control unit is programmed to perform a correction of an actuation process of the piezo actuator, the aim of said actuation process being to open the injection opening, on the basis of the idle stroke or the time delay.

In a further embodiment, the control unit is programmed to perform the correction by adjusting an actuation time of the piezo actuator.

Another embodiment provides a method for determining an idle stroke between a piezo actuator and a valve piston, which can be moved by the piezo actuator, of an injector for injecting fuel into an internal combustion engine or for determining a time delay which is caused by the idle stroke, wherein a plurality of electrical pulses of different pulse energy are applied to the piezo actuator, comprising the following steps: selecting the pulse energies in such a way that at least one of the pulses deflects the piezo actuator by less than the idle stroke, whereas at least one further one of the pulses deflects the piezo actuator by more than the idle stroke; detecting a frequency spectrum of a voltage signal, which is applied to the piezo actuator, after each of the pulses during a movement of the piezo actuator which is caused by the respective pulse; and ascertaining the idle stroke or the time delay from these frequency spectra.

In a further embodiment, ascertaining the idle stroke or the time delay from the frequency spectra comprises determining a natural frequency and/or a maximum amplitude in each of the frequency spectra.

In a further embodiment, a highest natural frequency is determined from the natural frequencies and the idle stroke or the time delay is ascertained from a pulse energy of the pulse which is associated with the highest natural frequency, and/or a lowest maximum amplitude is determined from the maximum amplitudes, and the idle stroke or the time delay is ascertained from a pulse energy of the pulse which is associated with the lowest maximum amplitude.

In a further embodiment, pulses are applied to the piezo actuator in a chronological order of increasing pulse energy, and the application of the pulses is terminated when a natural frequency curve, which comprises the natural frequencies as a function of the pulse energies of the pulses, has exceeded a local maximum, or when an amplitude curve, which comprises the maximum amplitudes as a function of the pulse energies of the pulses, has exceeded a local minimum.

BRIEF DESCRIPTION OF THE DRAWINGS

Example embodiments of the invention are discussed below in detail with reference to the drawings, in which:

FIG. 2b shows an electrical pulse which is applied to the piezo actuator,
FIG. 2c shows a time profile of a change in length of the piezo actuator,
FIG. 2d shows a plurality of electrical pulses of increasing pulse energy which are applied to the piezo actuator,
FIGS. 3a-d show a schematic illustration of the piezo actuator and a valve piston with various deflections of the piezo actuator,
FIG. 4 shows voltage curves at the piezo actuator over time,
FIG. 5 shows frequency spectra which are ascertained from movements of the piezo actuator,
FIG. 6 shows a natural frequency curve and an amplitude curve, it being possible to determine an idle stroke between the piezo actuator and the valve piston from said natural frequency curve and amplitude curve in each case.

DETAILED DESCRIPTION

Figure 1:
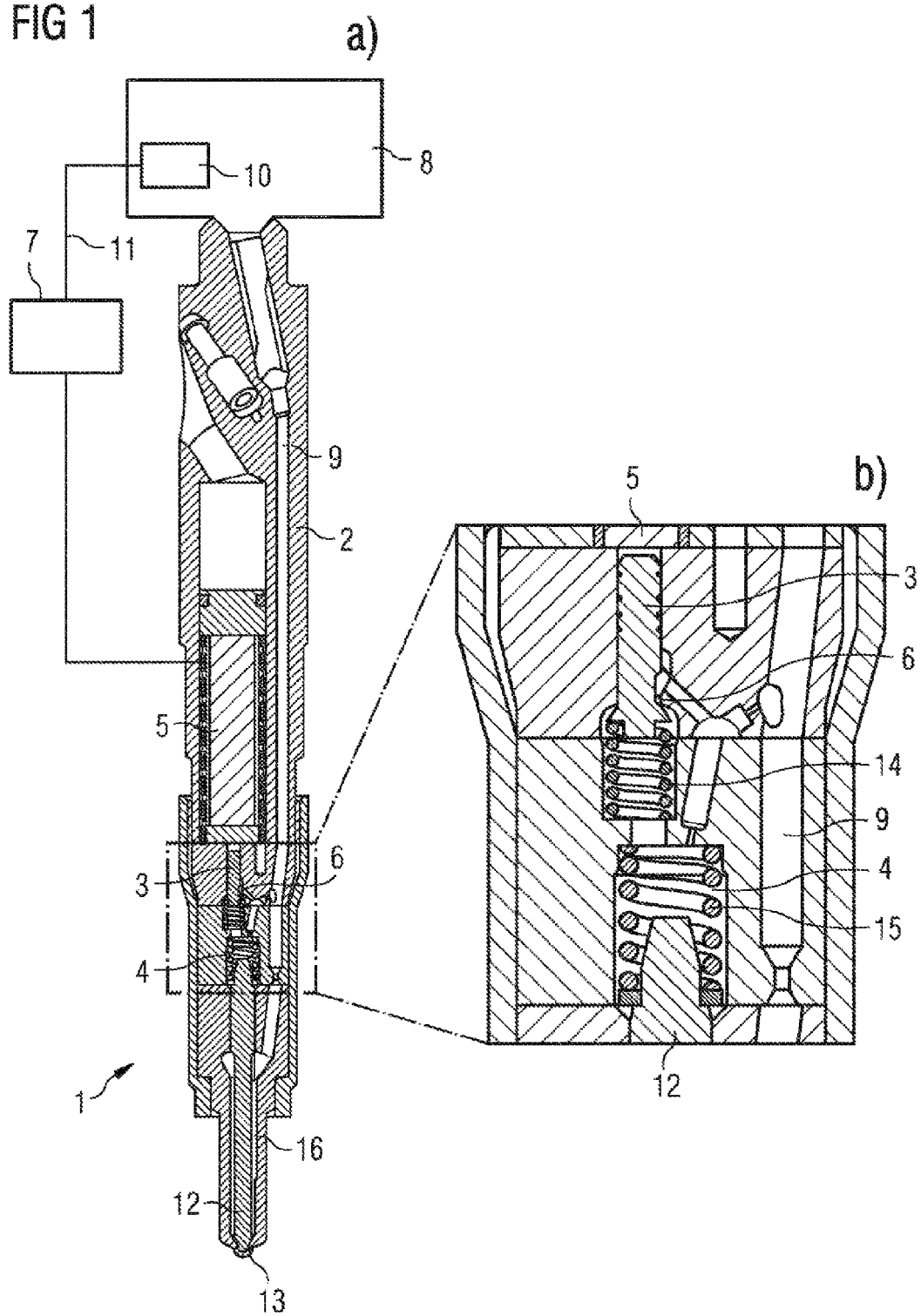
FIG. 1a shows a section through an injection device.
FIG. 1b shows a view of a detail from FIG. 1a,
FIG. 2a shows a time profile of a voltage which is applied to a piezo actuator.

Some embodiments are providing for controlling an injection device for an internal combustion engine in such a way that an idle stroke between a piezo actuator and a valve piston which can be moved by the piezo actuator, or a time delay which is caused by the idle stroke, can be determined in as precise a manner as possible, specifically as far as possible independently of an operating state and of a specific design of the injection device. The object likewise comprises proposing a method with which the determination process can be carried out.

One embodiment provides an injection device for an internal combustion engine, which injection device comprises an injector having a valve piston for controlling a flow of fuel, and having a piezo actuator for moving the valve piston, and also a control unit for actuating the piezo actuator, wherein the control unit is programmed to supply a plurality of electrical pulses of different pulse energy to the piezo actuator and to determine an idle stroke between the piezo actuator and the valve piston or a time delay which is caused by the idle stroke, wherein the control unit is further programmed to select the pulse energies such that a maximum deflection of a movement of the piezo actuator, which movement is caused by at least one of the pulses, is smaller than the idle stroke, whereas a maximum deflection of a movement of the piezo actuator, which movement is caused by at least one further one of the pulses, is greater than the idle stroke, specifically preferably only slightly greater, to detect a frequency spectrum of a voltage signal, which is applied to the piezo actuator, during the movement which is caused by the respective pulse, after each of the pulses, and to ascertain the idle stroke or the time delay from these frequency spectra.

Another embodiment provides a method for determining an idle stroke between a piezo actuator and a valve piston, which can be moved by the piezo actuator, of an injector for injecting fuel into an internal combustion engine or for determining a time delay which is caused by the idle stroke, wherein a plurality of electrical pulses of different pulse energy are applied to the piezo actuator, comprising the following steps:

selecting the pulse energies in such a way that at least one of the pulses deflects the piezo actuator by less than the idle stroke, whereas at least one further one of the pulses deflects the piezo actuator by—preferably only slightly—more than the idle stroke, detecting a frequency spectrum of a voltage signal, which is applied to the piezo actuator, after each of the pulses during a movement of the piezo actuator which is caused by the respective pulse, and ascertaining the idle stroke or the time delay from these frequency spectra.

In this case, the control unit is typically designed to apply the electrical pulses to the piezo actuator by applying an electrical voltage to the piezo actuator. An actuation time of the piezo actuator is then a time interval within which the voltage is different from zero or exceeds a specific threshold. A charging time is a first portion of the actuation time within which a charge current flows to the piezo actuator, with the result that the piezo actuator experiences a change in length. The charging time ends when current no longer flows to the piezo actuator. A discharging time is a last portion of the actuation time within which a discharge current flows away from the piezo actuator. The discharging time ends when current no longer flows away from the piezo actuator.

The control unit may be designed to detect the voltage signal in each case within a deflection time interval which extends, at most, from the end of the charging time to a beginning of the discharging time. The piezo actuator is deflected substantially by the change in length during the deflection time interval. The movement which is caused by the respective pulse and during which the control unit is designed to detect the voltage signal therefore comprises, in particular, the deflection time interval within which the movement is typically dominated by an oscillation, the exact properties of said oscillation depending, in a highly sensitive manner, on whether a maximum deflection of the movement is smaller or at least slightly larger than the idle stroke, that is to say whether the piezo actuator butts against an abutment on the valve piston.

The control unit may be designed to keep the charge current in each case largely or exactly constant during the charging time. In this case, the pulse energy, the change in length and the charging time of the pulses are in each case at least largely proportional to one another. In respect of the change in length, the proportionality to the respective pulse energy and, with a constant charge current, to the respective charging time at least applies, provided that the change in length is smaller than or equal to the idle stroke. When the piezo actuator is deflected specifically by the idle stroke by a pulse, the corresponding charging time or the corresponding pulse energy can therefore be used as a measure of the idle stroke. In particular, the charging time is equal to the time delay which is caused by the idle stroke in this case. Given in each case identical constant charge currents of the pulses, the determination of that pulse energy or that charging time at which the change in length is equal to the idle stroke is identical to the determination of the idle stroke or the time delay which is caused by the idle stroke.

In order to detect the voltage signal, the control unit is designed to use the piezo actuator as a voltage sensor. In this case, values of the voltage signal are typically in each case proportional to forces which act on the piezo actuator. In the case of the at least one movement of which the maximum deflection is smaller than the idle stroke, the forces which act on the piezo actuator comprise inertia forces and return forces of the piezo actuator. In the case of the at least one further movement of which the maximum deflection is greater than the idle stroke, the forces which act on the piezo actuator additionally at least partially comprise inertia forces and return forces of the valve piston. The control unit can be designed to draw, for example, a base value (offset) from the voltage signal and to then supply the voltage signal to a frequency analysis algorithm, for example an FFT algorithm which provides the frequency spectrum. The frequency spectrum can in each case be assigned the pulse energy or a pulse duration or charging time or a charging quantity of that pulse which causes the movement, while the voltage signal thereof, on which the frequency spectrum is based, is detected.

Ascertaining the idle stroke or the time delay from the frequency spectra according means it is not necessary for the valve piston to be moved by the piezo actuator to such an extent that the injector is opened, with the result that, for example, there is a pressure drop in a high-pressure store. Therefore, the idle stroke can be ascertained particularly quickly. Therefore, the determination process can also be carried out independently of a rail pressure. Accordingly, the method can be realized with the proposed injection device independently of an operating state of the injection device or the internal combustion engine. In particular, unlike in the prior art, injectors with valve pistons of any desired design can be used. Pressure-compensated and pressure-loaded valves are equally suitable. On account of the piezo actuator being used as a sensor, no additional hardware is required.

In one embodiment, the injector is designed in such a way that the movement of the piezo actuator comprises mechanical oscillations of the piezo actuator, and the voltage signal is correlated with the oscillations, wherein the frequency spectrum is in each case different in the case of the at least one movement of which the maximum deflection is smaller than the idle stroke, and in the case of the at least one further movement of which the maximum deflection is greater than the idle stroke, wherein the control unit is programmed to determine a difference between these frequency spectra. The oscillations take place primarily during the deflection time interval, that is to say after the piezo actuator has been deflected by the change in length as a result of the charge pulse. In the case of the first-mentioned movement, the frequency spectrum is determined by a mass and a stiffness of the piezo actuator. In the case of the at least one further movement, the frequency spectrum is additionally at least partially determined by a mass and a stiffness of the valve piston. Provided that a maximum deflection of the piezo actuator is smaller than the idle stroke, the frequency spectrum changes only slightly when different pulse energies of the pulses are applied to the piezo actuator since, in each case, the same mass and the same stiffness of the piezo actuator determine a shape of the frequency spectrum. However, as soon as the pulse energies of the pulses are greater than a pulse energy which is required to overcome the idle stroke, the frequency spectrum when increasing pulse energies of the pulses are applied to the piezo actuator changes noticeably however. As the pulse energy of the pulses increases, the piezo actuator specifically transmits more and more of the respective pulse energy to the valve piston, with the result that the respective frequency spectrum of increasing pulse energy is determined in increasing extents by the mass and the stiffness of the valve piston. Therefore, the control unit is preferably designed to establish, in particular, the described differences between the frequency spectra.

The injector usually comprises a nozzle needle for opening and closing an injection opening in the injector, wherein the valve piston is designed to open and close the injection opening using the nozzle needle, specifically indirectly in the case of typical designs of corresponding injectors. When the nozzle needle is open, fuel is injected into a combustion chamber in the internal combustion engine through the injection opening. The valve piston is preferably arranged in a valve which regulates a hydrostatic pressure in a control chamber which is connected to the high-pressure store by means of a fuel line. In this case, the valve can be in the form of a pressure-compensated or pressure-loaded valve. The pressure in the control chamber then acts on the nozzle needle and controls opening and closing of said nozzle needle. Opening and closing of the nozzle needle can additionally be controlled by a nozzle spring.

One embodiment makes provision for the control unit to be programmed to select a maximum pulse energy of the pulses and/or a maximum charging time and/or a maximum actuation time such that the injection opening remains closed. This therefore implies that fuel is not injected into the combustion chamber when the idle stroke is ascertained. Since the valve piston directly or indirectly opens and closes the nozzle needle, this further means that the valve piston is not moved at all or is moved only slightly. Therefore, particularly little time is required and particularly little energy is expended in order to determine the idle stroke in this case.

A further embodiment of the injection device makes provision for the control unit to be programmed to apply the pulses to the piezo actuator during normal operation of the injector such that the application is performed at a time between two injection processes. In this case, it is possible to repeatedly ascertain the idle stroke during normal operation. Even though the method for ascertaining the idle stroke can be carried out, as described, in any desired operating state of the injection device or of the internal combustion engine, it is feasible for the idle stroke itself to vary with the operating state. For example, it is feasible for the valve piston to be pressed slightly against the piezo actuator given a particularly high rail pressure. It may therefore be advantageous to repeatedly determine the idle stroke given a changing operating state. It has proven advantageous, particularly when ascertaining the idle stroke during normal operation between two injection processes, to select the pulse energies such that the injection opening remains closed as a result of the pulses being applied to the piezo actuator, with the result that there is no further injection and operation is impeded between the two injection processes.

In a further embodiment, the injection device comprises a high-pressure store for providing fuel to the injector, and a pressure gauge, which is connected to the control unit, for detecting a hydrostatic pressure in the high-pressure store at least before and/or after each of the pulses, wherein the control unit is additionally programmed to ascertain the idle stroke or the time delay from a pressure drop in the high-pressure store. This manner of operation is called a hydraulic method below. In the hydraulic method, the idle stroke is given by that pulse energy or can be determined from that pulse energy in which the pressure drop occurs as a result of the corresponding pulse being applied to the piezo actuator. In this case, it is particularly advantageous to combine this method with the process of ascertaining the idle stroke from the frequency spectra described here and to correlate results of the two procedures. Therefore, both the frequency spectrum and the pressure in the high-pressure store are preferably determined as a function of the respective pulse energy after each of the pulses. An idle stroke which is ascertained using the hydraulic method, or the corresponding pulse energy or time delay, forms an important reference value since the pressure drop in the high-pressure store coincides with the injection process or immediately precedes said injection process.

One embodiment makes provision for the control unit to be programmed to perform a correction of an actuation process of the piezo actuator, the aim of said actuation process being to open the injection opening, on the basis of the idle stroke or the time delay. In this case, the correction is preferably performed by adjusting an actuation time of the piezo actuator. The correction is preferably applied during normal operation of the internal combustion engine, wherein the time delay which results from the idle stroke is intended to be compensated. Therefore, it is possible to control an injection instant and an injection time, which is at least approximately proportional to an injected quantity of fuel, with a high degree of precision. This development can advantageously be combined with all the embodiments cited above and below.

It is further embodiment when ascertaining the idle stroke or the time delay from the frequency spectra comprises determining a natural frequency and/or a maximum amplitude in each of the frequency spectra. Each of the frequency spectra comprises amplitude values which are each clearly associated with a frequency value. The maximum amplitude is in each case a highest from amongst the amplitude values. The natural frequency is in each case a frequency value which is associated with the highest amplitude value. The maximum amplitude and the natural frequency are each characteristic of the movement of the piezo actuator which is caused by the respective pulse with the respective pulse energy.

It may also be advantageous when a highest natural frequency is determined from the natural frequencies of the various frequency spectra and the idle stroke or the time delay is ascertained from a pulse energy—or pulse duration or current interval—of the pulse which is associated with the highest natural frequency, and/or when a lowest maximum amplitude is determined from the maximum amplitudes of the frequency spectra, and the idle stroke or the time delay is ascertained from a pulse energy—or pulse duration or current integral—of the pulse which is associated with the lowest maximum amplitude.

In this case, it may be advantageous when the pulses are applied to the piezo actuator in a chronological order of increasing pulse energy, and the application of the pulses is terminated when a natural frequency curve, which comprises the natural frequencies as a function of the pulse energies or the charging times or charging quantities of the pulses, has exceeded a local maximum, or when an amplitude curve, which comprises the maximum amplitudes as a function of the pulse energies or the charging times of the pulses, has exceeded a local minimum. It has been found, specifically, that the natural frequency curve typically is at the local maximum at a pulse energy or at a charging time by which the corresponding pulse specifically causes a change in length, which corresponds to the idle stroke, of the piezo actuator. Accordingly, the amplitude curve will, according to experience, be at the local minimum at the pulse energy or at the charging time by which the corresponding pulse specifically causes a change in length, which corresponds to the idle stroke, of the piezo actuator. Applying the pulses in the chronological order of increasing pulse energy and terminating the application after exceeding the local maximum of the natural frequency curve or after exceeding the local minimum of the amplitude curve, the idle stroke is ascertained in a particularly time- and energy-saving manner, without unnecessary injection processes being triggered in the process.

FIG. 1a shows a section through an injection device 1 for an internal combustion engine (not shown) of a motor vehicle (not shown). The injection device 1 comprises an injector 2 having a valve piston 3 for controlling a flow of fuel into and out of a control chamber 4 and having a piezo actuator 5 for moving the valve piston 3. The valve piston 3 is part of a pressure-compensated servo valve 6 which controls a flow of fuel out of the control chamber 4. In addition, the injection device 1 comprises a control unit 7 for actuating the piezo actuator 5, said control unit being in the form of a programmable microcontroller. In addition, the injection device 1 comprises a high-pressure store 8, also called rail, for providing fuel (not shown) to the injector 2 by means of a fuel line 9. A pressure gauge 10 for detecting a hydrostatic pressure in the high-pressure store 8 (rail pressure) is arranged in the high-pressure store 8, wherein the pressure gauge 10 is connected to the control unit 7 by an electrical connection 11. Finally, the injector 2 has a nozzle needle 12 for opening and closing an injection opening 13 in the injector 2. The nozzle needle 12 can move in a nozzle chamber 16. When the injection opening 13 is open, fuel is injected from the injector 2 into a combustion chamber of the internal combustion engine in an injection process. The fuel (not shown) is, for example, gasoline. The rail pressure during operation of the injection device 1 is typically between 200 and 2000 bar.

FIG. 1b shows a view of a detail of the control chamber 4 from FIG. 1a. Here and below, recurring features are provided with identical reference symbols in each case. Said figure shows the valve piston 3 of the pressure-compensated servo valve 6 which, in addition to the valve piston 3, comprises a valve spring which closes the servo valve 6 when the piezo actuator 5 does not exert any force on the valve piston. If the servo valve 6 is closed, fuel is prevented from flowing out of the control chamber 4. Hydrostatic pressures in the control chamber 4 and in the nozzle chamber 16 are coupled to the rail pressure by virtue of the fuel line 9. The pressure in the control chamber 4 and a nozzle spring 15 ensure that a force which acts on the nozzle needle 12 holds the nozzle needle 12 closed against a pressure in the nozzle chamber 16 when the servo valve 6 is closed and closes the injection opening 13 (FIG. 1a). If the valve piston 3 of the servo valve 6 is moved in a first direction by means of the piezo actuator 5 and is opened against a counterforce of the valve spring 14, fuel flows out of the control chamber 4 by means of the servo valve 6. As a result, the pressure in the control chamber 4 and the pressure in the high-pressure store 8 decrease. The hydrostatic coupling, which is provided by means of the fuel line 9, between the high-pressure store 8, control chamber 4 and nozzle chamber 16 has the effect that a force which results on the nozzle needle 12 moves the nozzle needle 12 in the direction of the control chamber 4 against a counterforce of the nozzle spring 15, with the result that the nozzle needle 12 unblocks the injection opening 13 and fuel is injected into the combustion chamber. Reclosing the servo valve 6, which is effected by a movement of the piezo actuator in the direction which is opposite the first direction, leads to the injection opening 13 being closed by the nozzle needle 12, as a result of which the injection process is terminated. The valve piston 3 is accordingly designed to open and close the injection opening 13 using the nozzle needle 12.

In order to ascertain an idle stroke 27 (FIG. 3) between the piezo actuator 5 and the valve piston 3, the control unit 7 of the injection device 1 which is shown in FIG. 1a is designed to apply a plurality of electrical pulses 17', 17", etc. (see FIG. 2d) of different pulse energy to the piezo actuator 5. FIG. 2b shows, by way of example, a pulse 17 from amongst these pulses 17', 17", etc. in detail. In this case, the pulse 17 in FIG. 2b is provided by a charge current which flows to the piezo actuator 5 during a charging time 18 and which, as a result of a voltage 19 which is applied to the piezo actuator 5 by the control unit 7, flows to the piezo actuator 5, wherein a time profile of the voltage 19 is illustrated in FIG. 2a. The charging time is approximately 120 microseconds. During the charging time 18, the piezo actuator 5 experiences a change 20 in length, which is shown in FIG. 2c, which is proportional to the voltage 19. The charging time 18 is followed by a deflection time interval 21 which extends from an end of the charging time 18 to a beginning of a discharge time 24. The maximum value of the voltage 19 in FIG. 2a is approximately 60 volts, the maximum value of the change 20 in length in FIG. 2c is approximately 6 micrometers.

FIG. 2a likewise shows that the voltage 19 is superimposed on an oscillating voltage signal 22, which is applied to the piezo actuator 5, during the deflection time interval 21. This is attributed to mechanical oscillations 23 of the piezo actuator 5 which are triggered by an inertia and a stiffness of the piezo actuator 5 when the maximum change 20 in length of the piezo actuator 5 is reached. If the piezo actuator 5 is deflected as a result of the change 20 in length in such a way that it comes into contact with an abutment of the valve piston 3 (see FIGS. 3c and 3d), the mechanical oscillations 23 are also at least partially influenced by an inertia and a stiffness of the valve piston 3. FIG. 2c shows a superimposition of the change 20 in length of the piezo actuator 5, which is caused by the voltage 19 which is applied to the piezo actuator 5 by the control unit 7, on the oscillations 23. The voltage signal 22 is correlated with the mechanical oscillations 23 of the piezo actuator by means of the piezoelectric effect. The deflection time interval 21 is followed by the discharging time 24 during which the voltage 19, which is applied to the piezo actuator 5 by the control unit 7, and the change 20 in length respectively return to zero. The discharging time is likewise approximately 120 microseconds. A reduction in the voltage 19 during the discharging time 24 causes a discharge pulse 25. However, an electrical pulse within the meaning of this disclosure is to be understood to be in each case only the pulse 17 which is given by the charge current flowing to the piezo actuator 5 during the charging time 18.

The control unit 7 is designed to keep the charge current of the pulse 17 in each case approximately constant during the charging time 18, with the result that the charge current is of equal magnitude for each pulse of the plurality of pulses 17', 17", etc. (FIG. 2d). Therefore, a pulse energy of the pulse is proportional to the charging time 18. This is therefore a measure of the pulse energy. A time period which is given by the charging time 18, the deflection time interval 21 and the discharging time 24 is an actuation time 26 of the piezo actuator 5 which, in FIG. 2a, lasts approximately 300 microseconds (timescale in FIG. 2a is not linear in this region). The voltage 19 which is applied to the piezo actuator by the control unit 7 differs from zero, and the piezo actuator 5 is deflected, during the actuation time 26. During the actuation time 26, the piezo actuator 5 therefore performs a movement which is caused by the electrical pulse 17. The change 20 in length and the mechanical oscillations 23 on which said change in length is superimposed result in a deflection in the movement of the piezo actuator 5.

Some of the pulses 17', 17", etc. are shown in FIG. 2d. The control unit 7 is designed to apply the pulses 17', 17", etc. to the piezo actuator 5. In this case, the charge current is in each case the same and has a value of 3 A for the various pulses 17', 17", etc. The pulses 17', 17", etc. differ in each case only by different charging times 18', 18", etc. which increase in a chronological order. The pulses 17', 17", etc. of increasing pulse energy are therefore applied to the piezo actuator 5 by the control unit 7, wherein the pulse energies increase in a linear manner in this case. A timescale is illustrated in a non-linear manner in FIG. 2d. The aim of this is to take into account the fact that time intervals 31', 31'', etc. between in each case two of the pulses 17', 17'', etc. are generally significantly longer than the charging times 18', 18'', etc. The time intervals 31', 31'', etc. can be a few milliseconds long.

FIG. 3 schematically shows the piezo actuator 5 and the valve piston 3, these each having a cylindrical shape and being arranged along a common cylinder axis. FIG. 3a shows the piezo actuator 5 in a position in which it is not deflected. In FIGS. 3b to 3d, the electrical pulses 17', 17'', 17''' from FIG. 2d are applied to the piezo actuator 5 by means of the control unit 7 in each case. Therefore, the corresponding pulse energies increase in a linear manner from FIG. 3b to FIG. 3d. In this case, the piezo actuator 5 is shown in each case during deflection time intervals 21', 21'' and 21''' (see FIG. 4). The piezo actuator is therefore in each case located in a completely deflected position about which it performs mechanical oscillations 23', 23'' and 23'''.

A distance (FIG. 3) between the piezo actuator 5 which is not deflected and the valve piston 3 in FIG. 3a is an idle stroke 27 which is intended to be approximately 4 micrometers in this case. The idle stroke 27 causes a time delay between the actuation of the piezo actuator 5 by the control unit 7 and a movement of the valve piston 3 which is caused by the piezo actuator and is intended during normal operation. The aim is to determine the idle stroke 27 or a measure of this idle stroke with the aid of the injection device 1 and of the described method. So that the piezo actuator 5 can come into contact with the valve piston 3 and move said valve piston, the change 20 in length has to be greater than or equal to the idle stroke 27.

In FIG. 3b, a deflection 20' which is caused by the pulse 17' (see FIG. 2a) is smaller than the idle stroke 27, with the result that the piezo actuator 5 and the valve piston 3 do not come into contact. The mechanical oscillations 23' (see double-headed arrow) which are executed by the piezo actuator 5 in the event of this deflection 20' are therefore influenced only by an inertia and a stiffness of the piezo actuator 5.

FIG. 3c shows the situation in which a pulse energy of the pulse 17'' (see FIG. 2d) is slightly greater than a pulse energy of the pulse 17'. The deflection 20'' of the piezo actuator 5 which is caused by the pulse 17'' is slightly greater than the idle stroke 27. The mechanical oscillations 23'' (see double-headed arrow) which are executed by the piezo actuator 5 in the event of this deflection 20'' are therefore influenced not only by the inertia and the stiffness of the piezo actuator 5 but also at least partially by the inertia and the stiffness of the valve piston 3 since at least some of an oscillation energy is transmitted from the piezo actuator 5 to the valve piston 3 as a result of the contact between the piezo actuator 5 and the valve piston 3.

FIG. 3d also shows a situation in which a pulse energy of the pulse 17''' (see FIG. 2d) is greater than the pulse energies of the pulses 17' and 17''. The deflection 20''' of the piezo actuator 5 which is caused by the pulse 17''' is greater than the idle stroke 27, with the result that the valve piston 3 is moved by the piezo actuator 5. The mechanical oscillations 23''' (see double-headed arrow) which are executed by the piezo actuator 5 in the event of this deflection 20''' are significantly influenced by the inertia and the stiffness of the valve piston 3. This is the case particularly when a oscillation amplitude 28 of the oscillations 23''' as a result of the deflection 20''' of the piezo actuator 5 is small in comparison to a deflection 29 of the valve piston 3. In this case, the piezo actuator 5 and the valve piston 3 are in constant contact during the oscillations 23'''.

Movements of the piezo actuator 5, which are caused by the pulses 17', 17'' and 17''' (FIG. 2d) and comprise, in particular, the oscillations 23', 23'' and 23''' (FIGS. 3b to 3d), are correlated with voltage signals 22', 22'' and 22''' (FIG. 4) which are applied to the piezo actuator 5 by means of the piezoelectric effect. The designations in FIG. 4 are analogous to those in FIG. 2a. The pulse energies of the pulses 17', 17'' and 17''' (FIG. 2d) are reflected in FIG. 4 in the form of charging times 18', 18'' and 18''', that is to say the pulse energies are proportional to the respective charging times 18', 18'' and 18'''.

In order to ascertain the idle stroke 27 (FIG. 3), the control unit 7 is now designed to detect frequency spectra 32', 32'' and 32''' (FIG. 5) of the corresponding voltage signals 22', 22'' and 22''' (FIG. 4), after the corresponding pulses 17', 17'' and 17''', in FIG. 4 therefore in each case after the end of the charging times 18', 18'' and 18'''. This is done by the voltage signals 22', 22'' and 22''' each being sampled in the deflection time periods 21', 21'' and 21''' and being supplied, for example, to an FFT algorithm. The sampling is performed in each case in time steps of 5 µs. The actuation time 26 in FIG. 4 is 500 µs in this case.

The frequency spectra 32', 32'' and 32''' which are generated from the signals 22', 22'' and 22''' are illustrated in FIG. 5. Said frequency spectra each comprise frequency values on the abscissa 33, said frequency values each having exactly one associated amplitude value on the ordinate 34. The frequency spectra 32', 32'' and 32''' (FIG. 5) which are associated with the pulses 17', 17'' and 17''' (FIGS. 2d and 3) are different in each case.

The control unit 7 is designed to establish differences between the frequency spectra 32', 32'' and 32''' by determining in each case maximum amplitudes 35', 35'' and 35''', which each have associated natural frequencies 36', 36'' and 36''', for the spectra 32', 32'' and 32'''. FIG. 5 clearly shows that the spectrum 32'', which is associated with the pulse 17'', for which the deflection 20'' of the piezo actuator 5 is approximately equal to the idle stroke 27 (FIG. 3) from amongst the three illustrated spectra 32', 32'' and 32''' has the greatest natural frequency 36'' and the smallest maximum amplitude 35''. The natural frequencies 36', 36'' and 36''' and the maximum amplitudes 35', 35'' and 35''' are characteristic of each spectrum. The control unit 7 is designed to distinguish between the spectra 32', 32'' and 32''' on the basis of the natural frequencies 36', 36'' and 36''' and/or on the basis of the maximum amplitudes 35', 35'' and 35'''.

The spectra 32', 32'' and 32''' shown in FIG. 5 represent, merely by way of example, a plurality of frequency spectra which the control unit 7 is designed to detect after each of the plurality of pulses 17', 17'', etc. (FIG. 2d). FIG. 6 shows a natural frequency curve 37 which represents the natural frequencies 36', 36'' and 36''', which are determined from the frequency spectra 32', 32'' and 32''' by means of the control unit 7, as a function of the corresponding charging times 18', 18'' and 18'''. FIG. 6 also shows an amplitude curve 38 which represents the maximum amplitudes 35', 35'' and 35''', which are determined from the frequency spectra 32', 32'' and 32''' by means of the control unit 7, as a function of the corresponding charging times 18', 18'' and 18'''.

The control unit 7 is designed to ascertain, from the natural frequency curve 37, the charging time 18'' (this specifically effects the deflection 20'' of the piezo actuator 5 which is identical to the idle stroke 27 in FIG. 2c) which is necessary to overcome the idle stroke by determining that charging time 18'' which is associated with the maximum natural frequency value 36'' of the natural frequency curve 37. As an alternative, the control unit 7 is designed to ascertain, from the amplitude curve, the charging time 18'' which is required to overcome the idle stroke by determining that charging time 18″ which is associated with the minimum amplitude value 35″ of the amplitude curve 38. In accordance with the information provided at the outset, the process of ascertaining the charging time 18″ which is required to overcome the idle stroke 27 is equal to the process of identifying the idle stroke 27 itself since the variables are proportional to one another provided that the charge current 17′, 17″, etc. is identical in each case (see FIG. 2*d*). It is feasible for both methods to provide slightly differing results. In this case, ascertaining the idle stroke 27 by determining the maximum or the local maximum 36″ of the natural frequency curve 37 can be combined with ascertaining the idle stroke 27 by determining the minimum or the local minimum 35″ of the amplitude curve 38 by, for example, an average value of the two results being calculated.

In the case of the process of determining the charging time 18″ shown above, the pulses 17′, 17″ and 17‴ of increasing pulse energy are applied to the piezo actuator 5, and the application of the pulses is terminated when the local maximum 36″ of the natural frequency curve 37 is exceeded. To this end, the natural frequencies 36′, 36″, etc. are each determined immediately after the spectra 32′, 32″, etc. are detected. Accordingly, it is feasible to terminate the application of the pulses 17′, 17″, etc. when the local minimum 35″ of the amplitude curve 38 is exceeded.

In the above-described process of ascertaining the charging time 18″ which is required to overcome the idle stroke 27, it is expedient to select the pulse energies and the charging times 18′, 18″, etc. which are each proportional to the pulse energies such that the injection opening 13 in the injector 2 in each case remains closed and injection does not take place. This is best performed by the maximum charging time 18‴ being selected such that the valve piston 3 is not appreciably moved by the piezo actuator 5.

In addition, the above-described process of ascertaining the charging time 18″ which is required for overcoming the idle stroke 27 is performed during normal operation of the injection device 1 and the internal combustion engine, wherein the pulses 17′, 17″, etc. (FIG. 2*d*) are applied to the piezo actuator 5 between two injection processes. This means that an injection pulse (not shown), which opens the injection opening 13 using the nozzle needle 12, is in each case applied to the piezo actuator 5 before a first of the pulses 17′, 17″, etc. and then again only after a last of the pulses 17′, 17″, etc.

Figures 7, 8:
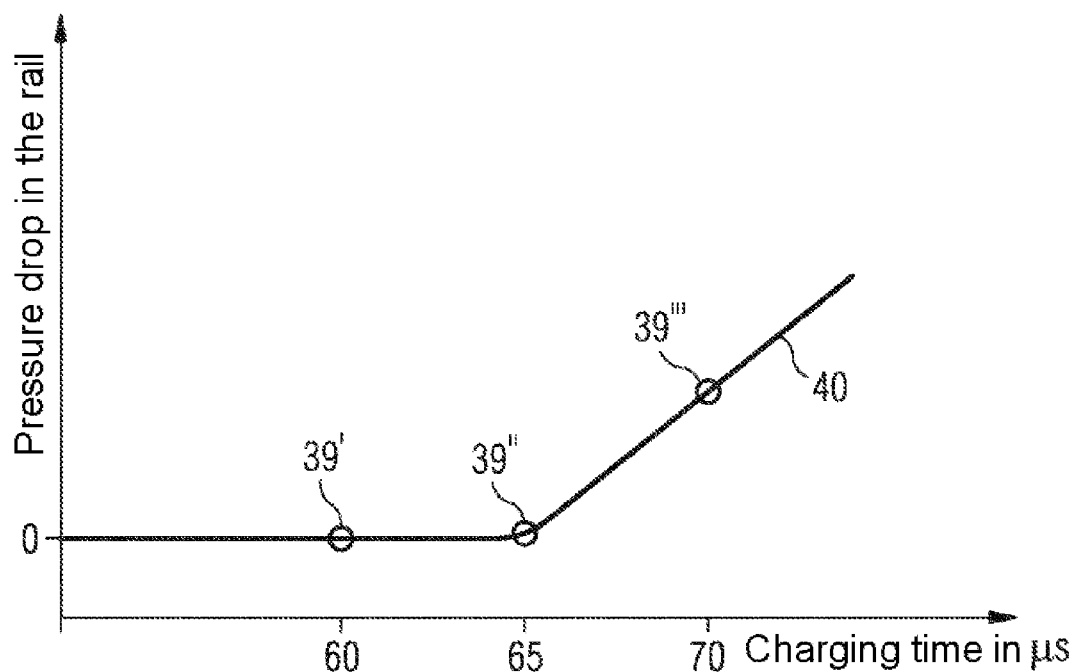
FIG. 7 shows a profile of a hydrostatic pressure in a high-pressure store as a result of the pulses from FIG. 2d being applied to the piezo actuator.
FIG. 8 shows, in a mathematically expressed manner, an algorithm for correcting an actuation time of the piezo actuator.

FIG. 7 shows a further way of ascertaining the charging time 18″ of the piezo actuator 5 which is required to overcome the idle stroke 27. To this end, a hydrostatic pressure in the high-pressure store 8 is detected by the pressure gauge 10 (FIG. 1) after each of the pulses 17′, 17″, etc., and the charging time 18″ is determined by the control unit 7 from a pressure drop in the high-pressure store 8. In this case, the sought charging time 18″ is that charging time at which the pressure drop in the high-pressure store 8 occurs, that is to say starting from which the pressure in the high-pressure store 8 decreases further as the charging times 18‴ etc. increase further. FIG. 7 shows a rail pressure curve 40, which represents the pressure 39′, 39″ and 39‴ which is in each case determined in the high-pressure store 8 by the pressure gauge 10 after each of the pulses 17′, 17″ and 17‴, as a function of the charging times 18′, 18″ and 18‴. Said figure clearly shows that the charging time 18″ which is determined in this way is the same charging time 18″ which was ascertained with the above-described method, which is intended to be called an electrical method. Even in the hydraulic method shown in FIG. 7, it is preferred to interrupt the application as soon as the pressure drop is established, so that there is no actual injection into the combustion chamber.

During the course of the above-described application of the pulses 17′, 17″, etc. to the piezo actuator 5, the electrical and the hydraulic methods are combined, that is to say the analysis of the frequency spectra 32′, 32″ and 32‴ and the process of determining the pressure drop in the high-pressure store 8 from the curve 40 are carried out in parallel, wherein the respectively obtained charging times 18″ are compared. It is feasible for both methods to provide slightly different results. A difference in the charging times obtained from the two methods is then taken into account when actuating the piezo actuator 5 during normal operation by, for example, the actuation time 26 being extended or shortened by this difference.

In the described injection device 1, the control unit 7 is programmed to perform a correction of the actuation process of the piezo actuator 5 on the basis of the charging time 18″, which represents a measure of the idle stroke 27, which is ascertained by means of the analysis of the frequency spectra. In particular, the control unit 7 is designed to correct the actuation time 26 (FIGS. 2 and 4) or the actuation instant 41 (FIG. 2) which is an instant at which the actuation time 26 begins. FIG. 8 shows one way of correcting the actuation time 26. In said figure, $\Delta t_{corr}$: denotes a corrected actuation time, $\Delta t_{norm}$: denotes a nominal actuation time, $\Delta t_{charge,act}$: denotes the previously-determined charging time 18″, $\Delta t_{charge,nom}$: denotes a nominal charging time.

In other words, the control unit 7 is designed to add double a difference between a charging time which is determined by measurement and a nominal charging time to form a nominal actuation time. The nominal actuation time $\Delta t_{nom}$ and the nominal charging time $\Delta t_{charge,nom}$ can be provided, for example, by a manufacturer, ideally in each case as a result of a measurement after production of the injection system 1.

What is claimed is:

1. An injection device for an internal combustion engine, the injection device comprising:
    an injector having a valve piston for controlling a flow of fuel,
    a piezo actuator for moving the valve piston, and
    a control unit for actuating the piezo actuator, wherein the control unit is programmed to:
        apply a plurality of electrical pulses of different pulse energy to the piezo actuator and to determine an idle stroke between the piezo actuator and the valve piston or a time delay caused by the idle stroke,
        select the pulse energies such that a maximum deflection of a movement of the piezo actuator, which movement is caused by at least one of the pulses, is smaller than the idle stroke, wherein a maximum deflection of a movement of the piezo actuator, which movement is caused by at least one further one of the pulses, is greater than the idle stroke,
        after each of the pulses, detect a frequency spectrum of a voltage signal applied to the piezo actuator during the movement caused by the respective pulse,
        determine the idle stroke or the time delay from the frequency spectra, and
        take the determined idle stroke or time delay caused by the idle stroke into account to control the actuation of an actuator.

2. The injection device of claim 1, wherein:
    the injector is configured such that the movement of the piezo actuator comprises mechanical oscillations of the piezo actuator, and the voltage signal is correlated with the oscillations, and the frequency spectrum for each pulse is different in the case of the at least one movement of which the maximum deflection is smaller than the idle stroke, and in the case of the at least one further movement of which the maximum deflection is greater than the idle stroke, wherein the control unit is programmed to determine a difference between these frequency spectra.

3. The injection device of claim 1, wherein the injector comprises a nozzle needle for opening and closing an injection opening in the injector, wherein the valve piston is configured to open and close the injection opening using the nozzle needle.

4. The injection device of claim 3, wherein the control unit is programmed to select a maximum pulse energy of the pulses such that the injection opening remains closed.

5. The injection device of claim 1, wherein the control unit is programmed to apply the pulses to the piezo actuator during normal operation of the injector such that the application is performed at a time between two injection processes.

6. The injection device of claim 1, comprising:
a high-pressure store configured to provide fuel to the injector, and
a pressure gauge connected to the control unit and configured to detect a hydrostatic pressure in the high-pressure store at least after each of the pulses,
wherein the control unit is programmed to determine the idle stroke or the time delay from a pressure drop in the high-pressure store.

7. The injection device of claim 1, wherein the control unit is programmed to perform a correction of an actuation process of the piezo actuator based on the idle stroke or the time delay, said actuation process being used to open the injection opening.

8. The injection device of claim 7, wherein the control unit is programmed to perform the correction by adjusting an actuation time of the piezo actuator.

9. A method for controlling the actuation of a piezo actuator to move a fuel injector valve piston for injecting fuel into an internal combustion engine, the method comprising
applying a plurality of electrical pulses of different pulse energy to the piezo actuator,
selecting the pulse energies such that at least one of the pulses deflects the piezo actuator by less than an idle stroke, wherein at least one further one of the pulses deflects the piezo actuator by more than the idle stroke,
after each pulse, detecting a frequency spectrum of a voltage signal applied to the piezo actuator during a movement of the piezo actuator caused by the respective pulse,
determining the idle stroke or the time delay from these frequency spectra, and
taking the determined idle stroke or time delay caused by the idle stroke into account to control the actuation of the piezo actuator.

10. The method of claim 9, wherein determining the idle stroke or the time delay from the frequency spectra comprises determining at least one of a natural frequency and a maximum amplitude in each of the frequency spectra.

11. The method of claim 10, comprising:
determining a highest natural frequency from the natural frequencies, and determining the idle stroke or the time delay from a pulse energy of the pulse associated with the highest natural frequency, and
determining a lowest maximum amplitude is determined from the maximum amplitudes, and determining the idle stroke or the time delay from a pulse energy of the pulse associated with the lowest maximum amplitude.

12. The method of claim 10, comprising:
applying the pulses to the piezo actuator in a chronological order of increasing pulse energy, and
terminating the application of the pulses in response to:
a natural frequency curve, which comprises the natural frequencies as a function of the pulse energies of the pulses, exceeding a local maximum, or when
an amplitude curve, which comprises the maximum amplitudes as a function of the pulse energies of the pulses, exceeding a local minimum.

13. An injection device for an internal combustion engine, the injection device comprising:
an injector having a valve piston for controlling a flow of fuel, the injector comprises a nozzle needle for opening and closing an injection opening in the injector, wherein the valve piston is configured to open and close the injection opening using the nozzle needle,
a piezo actuator for moving the valve piston, and
a control unit for actuating the piezo actuator, wherein the control unit is programmed to:
apply a plurality of electrical pulses of different pulse energy to the piezo actuator and to determine an idle stroke between the piezo actuator and the valve piston or a time delay caused by the idle stroke,
select the pulse energies such that a maximum deflection of a movement of the piezo actuator, which movement is caused by at least one of the pulses, is smaller than the idle stroke, wherein a maximum deflection of a movement of the piezo actuator, which movement is caused by at least one further one of the pulses, is greater than the idle stroke, wherein the maximum pulse energy of the pulses is selected such that the injection opening remains closed,
after each of the pulses, detect a frequency spectrum of a voltage signal applied to the piezo actuator during the movement caused by the respective pulse, and
determine the idle stroke or the time delay from the frequency spectra.

* * * * *